(12) United States Patent
Xie et al.

(10) Patent No.: US 10,795,512 B2
(45) Date of Patent: Oct. 6, 2020

(54) TOUCH SUBSTRATE HAVING CONDUCTIVE LINES AND GROUND CONDUCTIVE PATTERN BETWEEN ADJACENT CONDUCTIVE LINES, METHOD FOR MANUFACTURING THE SAME, AND TOUCH PANEL

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Xiaodong Xie, Beijing (CN); Ming Hu, Beijing (CN); Ming Zhang, Beijing (CN); Min He, Beijing (CN); Jian Tian, Beijing (CN); Qingpu Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 15/750,638

(22) PCT Filed: Jun. 1, 2017

(86) PCT No.: PCT/CN2017/086835
§ 371 (c)(1),
(2) Date: Feb. 6, 2018

(87) PCT Pub. No.: WO2018/001033
PCT Pub. Date: Jan. 4, 2018

(65) Prior Publication Data
US 2020/0089349 A1 Mar. 19, 2020

(30) Foreign Application Priority Data
Jun. 30, 2016 (CN) .......................... 2016 1 0509250

(51) Int. Cl.
*G06F 3/044* (2006.01)

(52) U.S. Cl.
CPC .... *G06F 3/044* (2013.01); *G06F 2203/04103* (2013.01); *G06F 2203/04107* (2013.01); *G06F 2203/04111* (2013.01)

(58) Field of Classification Search
CPC ........... G06F 3/044; G06F 2203/04107; G06F 2203/04103; G06F 2203/04111;
(Continued)

(56) References Cited

U.S. PATENT DOCUMENTS

2012/0182230 A1* 7/2012 Wang ...................... G06F 3/044
345/173
2013/0093724 A1* 4/2013 Liu .......................... G06F 3/044
345/174
(Continued)

FOREIGN PATENT DOCUMENTS

CN 103186287 A 7/2013
CN 104615296 A 5/2015
(Continued)

OTHER PUBLICATIONS

International Search Report and Written Opinion for Application No. PCT/CN2017/086835, dated Aug. 30, 2017, 11 Pages.

*Primary Examiner* — Rodney Amadiz
(74) *Attorney, Agent, or Firm* — Brooks Kushman P.C.

(57) ABSTRACT

The present disclosure provides a touch substrate and a method for manufacturing the same, and a touch panel, belonging to the field of touch technology. The touch substrate is divided into a touch area and a wiring area located at a periphery of the touch area, including: a black
(Continued)

matrix pattern arranged on the wiring area; a plurality of conductive lines located on the black matrix pattern; and a ground conductive pattern located between two adjacent conductive lines of the plurality conductive lines on the black matrix pattern.

19 Claims, 2 Drawing Sheets

(58) Field of Classification Search
CPC .. G06F 3/04164; G06F 3/0412; G06F 3/0418; H05K 1/0259
See application file for complete search history.

(56) References Cited

U.S. PATENT DOCUMENTS

| | | | | |
|---|---|---|---|---|
| 2013/0147730 A1* | 6/2013 | Chien | ................... | G06F 3/0412 345/173 |
| 2014/0085250 A1* | 3/2014 | Cok | ........................ | G06F 3/044 345/174 |
| 2015/0220193 A1 | 8/2015 | Choe et al. | | |
| 2015/0301645 A1 | 10/2015 | Mu et al. | | |
| 2016/0026330 A1* | 1/2016 | Shepelev | ................. | G06F 3/044 345/174 |
| 2016/0147324 A1 | 5/2016 | Chang et al. | | |
| 2017/0060281 A1 | 3/2017 | Xie et al. | | |
| 2017/0092639 A1 | 3/2017 | Fan et al. | | |
| 2017/0123576 A1* | 5/2017 | Ho | ......................... | G06F 3/0416 |
| 2017/0293374 A1 | 10/2017 | Chen et al. | | |

FOREIGN PATENT DOCUMENTS

| | | |
|---|---|---|
| CN | 104656984 A | 5/2015 |
| CN | 104834407 A | 8/2015 |
| CN | 105117071 A | 12/2015 |
| CN | 105138188 A | 12/2015 |
| CN | 105183219 A | 12/2015 |
| CN | 105425458 A | 3/2016 |
| CN | 106201074 A | 12/2016 |
| TW | 201535172 A | 9/2015 |

* cited by examiner

TOUCH SUBSTRATE HAVING CONDUCTIVE LINES AND GROUND CONDUCTIVE PATTERN BETWEEN ADJACENT CONDUCTIVE LINES, METHOD FOR MANUFACTURING THE SAME, AND TOUCH PANEL

CROSS-REFERENCE TO RELATED APPLICATIONS

This application is the U.S. national phase of PCT Application No. PCT/CN2017/086835 filed on Jun. 1, 2017, which claims priority to Chinese Patent Application No. 201610509250.7 filed on Jun. 30, 2016, which are incorporated herein by reference in their entireties.

TECHNICAL FIELD

The present disclosure relates to the field of touch technology, and in particular, to a touch substrate and a method for manufacturing the same, and a touch panel.

BACKGROUND

Currently, a capacitive touch panel is mainly available commercially. Particularly a new generation of touch equipment represented by an Apple iPhone brings a great change in the capacitive touch panel. With a rapid development of the capacitive touch panel, there is an increasingly high demand for an ESD (Electro-Static Discharge) performance of a touch product. In the case that a person uses his or her fingers to touch the touch panel, a static electricity would be caused. Usually, the static electricity has a very large voltage. If the static electricity enters in the touch panel, the touch panel is certainly affected adversely.

In the touch panel, a conductive wiring is manufactured on a black matrix pattern. Usually, the black matrix pattern has a relatively good insulation performance. However, subsequent to a plurality of high-temperature processes, an electrical resistivity of the black matrix pattern is reduced and the insulation performance of the black matrix pattern deteriorates. Hence, the static electricity may be released through the black matrix pattern between two adjacent conductive lines particularly, two conductive lines has a relatively close distance therebetween), thus causing the ESD between the two conductive lines.

SUMMARY

The technical problem to be solved in the present disclosure is to provide a touch substrate, a method for manufacturing the same, and a touch panel, capable of improving an anti-ESD ability of the touch panel.

In order to solve the above-mentioned technical problem, an embodiment of the present disclosure provides the following technical solution.

In one aspect, there is provided a touch substrate, including a touch area and a wiring area located at a periphery of the touch area. The touch substrate includes: a black matrix pattern arranged on the wiring area; a plurality of conductive lines located on the black matrix pattern; and a ground conductive pattern located between two adjacent conductive lines of the plurality conductive lines on the black matrix pattern.

Optionally, the conductive pattern is made of a metal.

Optionally, a space between the two adjacent conductive lines is less than a threshold value. Further, the threshold value ranges from 30 to 100 micrometers.

Optionally, a space between the conductive pattern and any one of the two adjacent conductive lines ranges from 5 to 20 micrometers.

Optionally, the two adjacent conductive lines are in parallel with each other, and an extension direction of the conductive pattern is parallel to that of the two adjacent conductive lines.

Further, the conductive pattern has a thickness in a direction perpendicular to the extension direction less than 90% of the space between the two adjacent conductive lines. Further, the conductive pattern has a thickness in a direction perpendicular to the extension direction greater than a half of the space between the two adjacent conductive lines.

Further, the space between the conductive pattern and one of the two adjacent conductive lines is the same as that between the conductive pattern and the other of the two adjacent conductive lines.

Optionally, the touch substrate further includes: a planarization layer covering the conductive lines and the conductive pattern.

The embodiment of the present disclosure further provides a touch panel, including any one of the above-mentioned touch substrates and a protective structure covering the touch substrate.

Optionally, a ground point located outside the touch substrate, wherein the protective structure is provided with a via hole, and the conductive pattern is electrically connected to the ground point through the via hole.

Optionally, the touch panel further includes: a conductive lead that passes through the via hole and connects the conductive pattern and the ground point.

Optionally, the protective structure is an anti-splinted film.

The embodiment of the present disclosure further provides a method for manufacturing a touch substrate, the touch substrate being divided into a touch area and a wiring area surrounding the touch area. The manufacturing method includes forming a black matrix pattern on the wiring area; forming a plurality of conductive lines on the black matrix pattern; forming a ground conductive pattern between two adjacent conductive lines of the plurality conductive lines.

Optionally, before the step of forming a black matrix pattern on the wiring area, the method further includes: providing a base substrate; the step of forming a black matrix pattern on the wiring area includes: forming the black matrix pattern on the wiring area of the base substrate; before the step of forming a plurality of conductive lines on the black matrix pattern, the method further includes: depositing a first transparent conductive layer on the base substrate, patterning the first transparent conductive layer, and forming a bridge for connecting touch electrodes, and depositing an insulating material layer on the base substrate, patterning the insulating material layer, and forming a pattern of a first insulating layer covering the bridge; the step of forming a conductive line on the black matrix pattern includes: depositing a second transparent conductive layer on the base substrate, patterning the second transparent conductive layer, and forming a pattern of the touch electrodes, the touch electrodes being formed by the conductive lines, and a groove being formed between the two adjacent conductive lines; and the step of forming a ground conductive pattern between the two adjacent conductive lines includes: depositing a metal layer on the base substrate, patterning the metal layer, and forming a peripheral metal line and the conductive pattern on the black matrix pattern.

Optionally, the method further includes: depositing a resin material layer on the base substrate, patterning the resin material layer, and forming a resin protective layer covering an edge area of the touch substrate on the base substrate.

Optionally, the method further includes: attaching an anti-splinted film on the touch substrate, hollowing out the anti-splinted film to form a via hole; and forming a conductive lead that connects a ground point and the conductive pattern through the via hole.

Optionally, the groove has a width ranging from 30 to 100 micrometers.

Optionally, a space between the conductive pattern and any one of the two adjacent conductive lines ranges from 5 to 20 micrometers.

The embodiment of the present disclosure has the following advantageous effects.

In the above-mentioned solution, on the black matrix pattern, due to a decrease in an electrical resistivity of the black matrix pattern, the ESD phenomenon tends to occur between the two adjacent conductive lines with a relatively small distance. In the present embodiment, the grounded conductive pattern arranged between the two adjacent conductive lines on the black matrix pattern, may conduct the static electricity between the two adjacent conductive lines, thereby avoiding the ESD therebetween, and further improving the anti-ESD ability of the touch substrate.

REFERENCE NUMERALS

| conductive line-1 | black matrix pattern-2 | base substrate-3 |
| conducive pattern-4 | protective structure-5 | conductive lead-6 |

DETAILED DESCRIPTION

In order to clarify the technical problem to be solved, the technical solution and advantages according to the embodiments of the present disclosure, a detailed description will be provided below in combination with drawings and embodiments.

Figure 1:
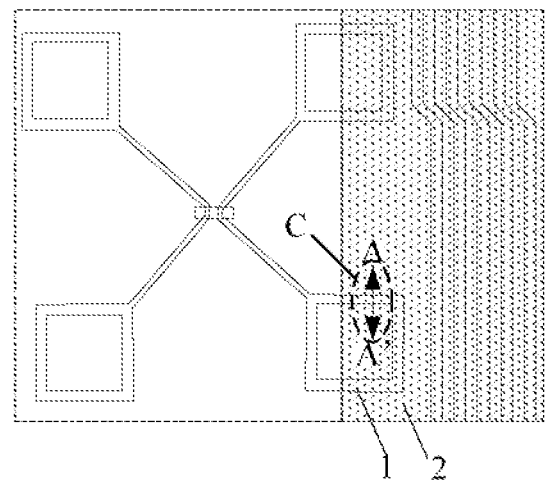
FIG. 1 is a partial schematic view of a touch panel.
Figure 2:
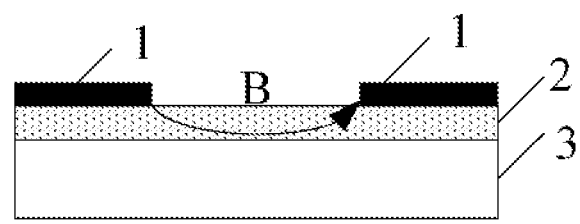
FIG. 2 is a sectional schematic diagram of part C of FIG. 1 along an AA' direction.

FIG. 1 is a partial schematic view of a touch panel, and FIG. 2 is a sectional schematic diagram of part C of FIG. 1 along an AA' direction.

As a positioning device by calculating a contact coordinate inside a panel, the touch panel detects a touch position of a user, and then sends the detected information to a controller, and converts the same into a coordinate, transmits the coordinate to a central processing unit, and receives a signal returned by the central processing unit simultaneously and executes the signal, as so to achieve a man-machine interaction.

As shown in FIGS. 1 and 2, the touch panel includes a touch area for a touch detection and a wiring area surrounding the touch area. At the wiring area, the conductive line 1 is manufactured on the black matrix pattern 2 which is usually made of a carbon sphere. Usually, the black matrix pattern 2 has a relatively good insulation performance. However, subsequent to a plurality of high-temperature processes, the black matrix pattern 2 has reduced in an electrical resistivity and the insulation performance. In this way, in the case that there is a relatively small distance especially between the two adjacent conductive lines 1 in the wiring areas, as shown in FIG. 2, the static electricity is released through the black matrix pattern 2 between the two conductive lines 1, which causes the ESD between the two conductive lines 1.

In order to solve the above-mentioned problem, the embodiment of the present disclosure provides a touch substrate and a method for manufacturing the same, and a touch panel, capable of improving the anti-ESD ability of the touch panel.

Figure 3:
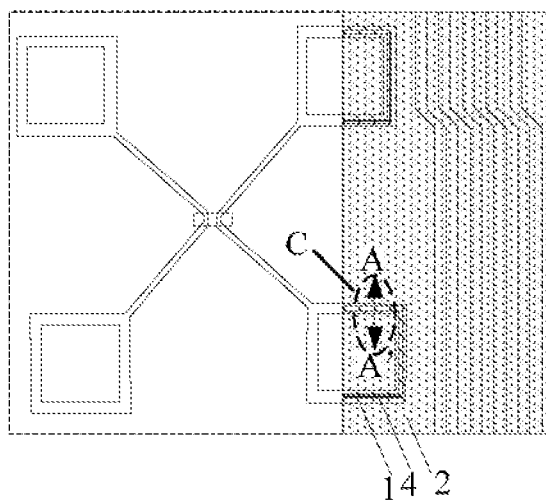
FIG. 3 is a partial schematic view of a touch substrate according to some embodiments of the present disclosure.

The embodiment of the present disclosure provides a touch substrate, including a touch area located on the base substrate 3 and a wiring area located at a periphery of the touch area (in other words, the touch substrate is divided into the touch area and the wiring area located at the periphery of the touch area). As shown in FIG. 3, the wiring area includes: a black matrix pattern 2 covering the wiring area; a conductive line 1 located on the black matrix pattern 2, wherein a grounded conductive pattern 4 is arranged between the two adjacent conductive lines 1 on the black matrix pattern 2.

On the black matrix pattern, due to a reduction in an electrical resistivity of the black matrix pattern, the ESD phenomenon tends to occur between the two adjacent conductive lines with a relatively small distance. Hence, in the present embodiment, the grounded conductive pattern, arranged between the two adjacent conductive lines on the black matrix pattern, may conduct the static electricity between the two adjacent conductive lines, thereby avoiding the ESD therebetween, and further improving the anti-ESD ability of the touch substrate.

Preferably, the conductive pattern 4 is made of a metal. Compared with the transparent conductive material, the metal material has a relatively good conductivity, and may conduct the static electricity between the two adjacent conductive lines 1 better.

Since there is a relatively low possibility of ESD between the two adjacent two conductive lines with a relatively large distance, in order to reasonably distribute resources, in the present embodiment, preferably, the conductive pattern 4 is arranged between the two adjacent conductive lines with a relatively small distance, that is, the conductive pattern 4 is arranged between the two adjacent conductive lines with a space less than the threshold value. Specifically, the conductive pattern 4 may be arranged between the two adjacent conductive lines with a space that ranges from 30 to 100 micrometers.

The conductive pattern 4 and any one of its adjacent conductive lines 1 are insulated with each other. Therefore, there needs a certain space between the conductive pattern 4 and any one of the two adjacent conducive lines 1.

Preferably, the space between the conductive pattern 4 and the adjacent conductive line 1 ranges from 5 to 20 micrometers. In the case that the distance between the conductive pattern 4 and the adjacent conducive line 1 is too small, for example, less than 5 micrometers, technically, it is difficult to manufacture the conductive pattern 4 between the adjacent conductive lines 1. In the case that the distance between the conductive pattern 4 and the adjacent conductive line 1 is too large, for example, larger than 20 micrometers, a relatively large gap exists between the conductive pattern 4 and the conductive line 1, and the conductive pattern 4 cannot effectively conduct the static electricity at the gap.

In the embodiment, the two adjacent conductive lines 1 located on the black matrix pattern 2 are in parallel with each other, and the extension direction of the conductive pattern 4 is parallel to that of the adjacent conductive lines 1 in this way, the length of the conductive pattern 4 may approximate that of the conductive line 1 located on the black matrix pattern 2 as much as possible, and can be long enough, so the conductive pattern 4 is capable of conducting the static electricity in most areas on the black matrix pattern 2 and improving the anti-ESO ability of the touch substrate.

Optionally, the conductive pattern has a thickness in a direction perpendicular to the extension direction less than 90% of the space between the two adjacent conductive lines. Optionally, the conductive pattern has a thickness in a direction perpendicular to the extension direction greater than a half of the space between the two adjacent conductive lines. For example, in the case that the space between the two adjacent conductive lines is 100 micrometers, the width of the conductive pattern in a direction perpendicular to the extension direction may range from 60 to 90 micrometers. The above-mentioned example is merely exemplary, and the width of the conductive pattern in a direction perpendicular to the extension direction of the adjacent conductive lines is not limited in the present disclosure, as long as it is less than the space between the two adjacent conductive lines. Optionally, the conductive pattern may have the same or different space with its two adjacent conductive lines.

Further, the touch substrate further includes: a planarization layer covering the conductive line 1 and the conductive pattern 4. The planarization layer may provide a flat surface for the subsequent processes.

Figure 5:
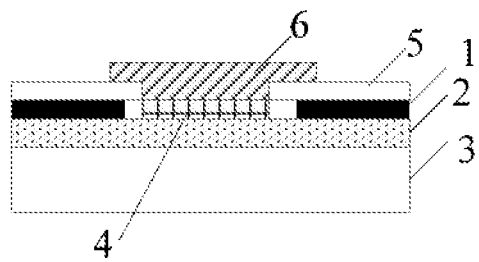
FIG. 5 is a partial schematic view of a touch panel according to some embodiments of the present disclosure.

As shown in FIG. 5, the embodiment of the present disclosure further provides a touch panel, including any one of the above-mentioned touch substrates and a protective structure 5 covering the touch substrate. The touch panel of the present embodiment is applicable to a human interface device. This touch panel may be applied to a smart phone, a tablet PC, a laptop, or the like.

Further, the touch panel further includes a ground point located outside the touch substrate, as shown in FIG. 5. The protective structure 5 is provided with a via hole, and the conductive pattern 4 is electrically connected with the ground point outside the touch substrate through the via hole, and in this way, may realize grounding through the ground point.

Further, as shown in FIG. 5, the touch panel may further include: a conductive lead 6 passing through the via hole and connecting the conductive pattern and the ground point. The static electricity between the adjacent conductive lines 1 transmitted to the ground point via the conductive lead 6 connected with the conductive pattern 4.

In the embodiment, the protective structure is an anti-splinted film. Of course, the protective structure may also be other ones for protecting the lines on the touch substrate, for example, a packaging substrate arranged opposite to the touch substrate, or the like.

Figure 4:
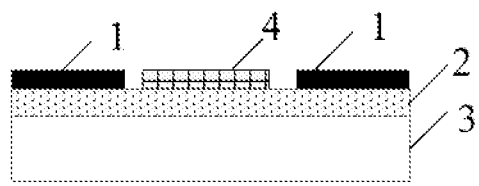
FIG. 4 is a sectional schematic diagram of part C of FIG. 3 along the AA' direction.

The embodiment of the present disclosure provides a method for manufacturing a touch substrate, herein the touch substrate includes a touch area and a wiring area surrounding the touch area, and the manufacturing method includes: forming a black matrix pattern on the wiring area and forming a plurality of conductive lines on the black matrix pattern. As shown in FIG. 4, the manufacturing method further includes: forming a grounded conductive pattern 4 between the two adjacent conductive lines 1.

On the black matrix pattern, due to a reduction in an electrical resistivity of the black matrix pattern, the ESD phenomenon tends to occur between the two adjacent conductive lines with a relatively small distance. Therefore, in the present embodiment, the grounded conductive pattern is arranged between the two adjacent conductive lines on the black matrix pattern. This conductive pattern may conduct the static electricity between the two adjacent conductive lines, thereby avoiding the ESD therebetween, and further improving the anti-ESD ability of the touch substrate.

Since there is a relatively low possibility of ESD between the two adjacent two conductive lines with a relatively large distance, in order to reasonably distribute resources, in the present embodiment, preferably, the conductive pattern 4 is arranged between the two adjacent conductive lines with a relatively small distance less than the threshold value. A person skilled in the art may determine this threshold value as needed. For example, this threshold value may be determined according to factors such as a material and shape of the conductive line, a current via the conductive line and a local air humidity and temperature, or the like. Further, the threshold value ranges from 30 to 100 micrometers. Specifically, the conductive pattern 4 may be formed between the two adjacent conductive lines with a space ranging from 30 to 100 micrometers.

The conductive pattern 4 and any one of its adjacent conductive lines 1 are insulated with each other. Therefore, there needs a certain space between the conductive pattern 4 and any one of adjacent conducive lines 1. Preferably, the space between the conductive pattern 4 and the adjacent conductive line 1 ranges from 5 to 20 micrometers. In the case that the distance between the conductive pattern 4 and the adjacent conducive line 1 is too small, for example, less than 5 micrometers, technically; it is difficult to manufacture the conductive pattern 4 between the adjacent conductive lines 1, in the case that the distance between the conductive pattern 4 and the adjacent conductive line 1 is too large, for example, larger than 20 micrometers, a relatively large gap exists between the conductive pattern 4 and the conductive line 1, and the conductive pattern 4 cannot effectively conduct the static electricity at the gap.

In the embodiment, the two adjacent conductive lines 1 located on the black matrix pattern 2 are in parallel with each other, and the extension direction of the conductive pattern 4 is parallel to that of the adjacent conductive lines 1. In this way, the length of the conductive pattern 4 may approximate that of the conductive line 1 located on the black matrix pattern as much as possible, and can be long enough, so the conductive pattern 4 is capable of conducting the static electricity in most areas on the black matrix pattern 2 and improving the anti-ESD ability of the touch substrate.

Figure 6:
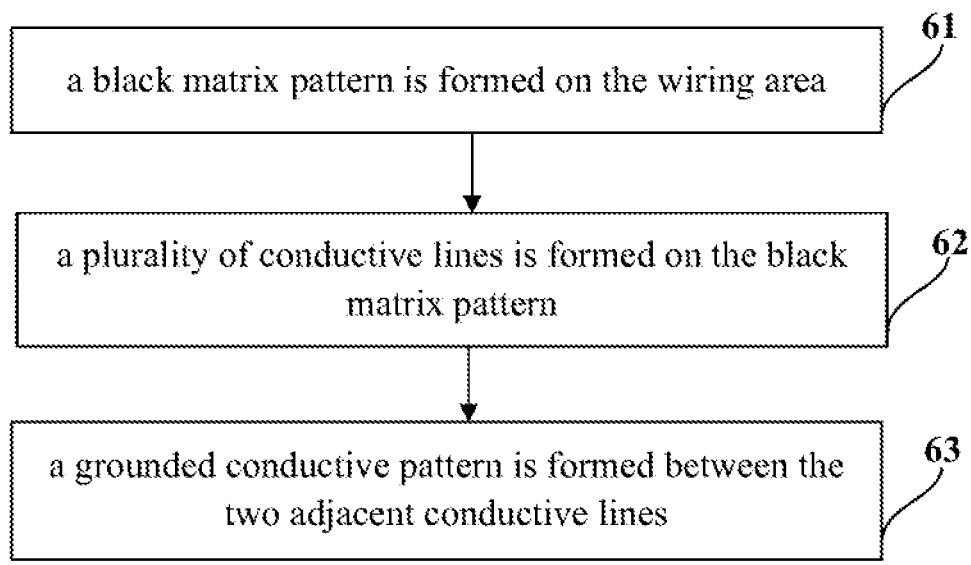
FIG. 6 is a schematic flow chart of a method for manufacturing a touch substrate according to some embodiments of the present disclosure.

The embodiment of the present disclosure further provides a method for manufacturing any one of the above-mentioned touch substrates, wherein the touch substrate is divided into the touch area and the wiring area surrounding the touch area, as shown in FIG. 6, and the method includes the following steps.

In S61, a black matrix pattern is formed on the wiring area.

In S62, a plurality of conductive lines is formed on the black matrix pattern.

In S63, a grounded conductive pattern is formed between the two adjacent conductive lines of the plurality conductive lines. To be exemplary, the method for manufacturing a touch substrate according to the present embodiment specifically includes the following processes.

In the first patterning process, a base substrate is provided, and the base substrate may be a glass substrate or a quartz substrate.

A nontransparent black material layer is formed on the base substrate, and is patterned to form a black matrix pattern that covers the edge area of the touch substrate.

In the second patterning process, a first transparent conductive layer is deposited on the base substrate subjected to the first patterning process. Specifically; the first transparent conductive layer may be made of ITO or IZO, and is patterned to form a bridge configured to connect the touch electrode.

In the third patterning process, an insulating material layer is deposited on the base substrate subjected to the second patterning process. Specifically, the insulating material layer may be made of a resin, silicon nitride or silicon oxide.

The insulating material layer is patterned to form the pattern of the first insulating layer covering the bridge, and the insulation between the bridge and the touch electrode may be realized by the first insulating layer.

In the fourth patterning process, a second transparent conductive layer is deposited on the base substrate subjected to the third patterning process. Specifically, the second transparent conductive layer may be made of ITO or IZO.

The second transparent conductive layer is patterned to form the pattern of the touch electrode. The touch electrode is formed by two parallel transparent conductive lines. The groove is formed between the two conductive lines, and it has a width ranging from 30 to 100 micrometers.

At the edge area of the touch substrate, the touch electrode overlaps onto the black matrix pattern. Since the reduction in the electrical resistivity of the black matrix pattern, the ESD phenomenon tends to occur between the two conductive lines with a relatively small distance.

In the fifth patterning process, a metal layer is deposited on the base substrate subjected to the fourth patterning process, and is patterned, and a peripheral metal line and the conductive pattern located between the adjacent conductive lines are formed on the black matrix pattern. In the present embodiment, the conductive pattern is formed simultaneously with the peripheral metal line by one patterning process. Thus, the technical solution of the present embodiment may be implemented without adding any patterning process.

Of course, the conductive pattern and the peripheral metal line may also be formed by different patterning processes.

In the sixth patterning process, a resin material layer is deposited on the base substrate subjected to the fifth patterning process, the resin material layer is patterned, and a resin protective layer for at least covering the edge area of the touch substrate is formed on the base substrate.

The touch substrate according to the present embodiment is manufactured through the above-mentioned steps.

Afterwards, in the case that the touch panel is manufactured, the anti-splinted film may be attached on the touch substrate subjected to the above-mentioned steps. The anti-splinted film is hollowed out to form the via hole, and then the conductive lead that connects the outside ground point and the conductive pattern on the touch substrate through the via hole is formed. In this way, the static electricity between the adjacent conductive lines is transmitted to the ground point via the conductive lead of the conductive pattern, thereby conducting the static electricity between the two adjacent conductive lines, avoiding the ESD therebetween, and further improving the anti-ESD ability of the touch substrate.

The above is merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A touch substrate, divided into a touch area and a wiring area located at a periphery of the touch area, comprising: a black matrix pattern arranged on the wiring area; a plurality of conductive lines located on the black matrix pattern; and a ground conductive pattern located between two adjacent conductive lines of the plurality conductive lines on the black matrix pattern, wherein a space between the two adjacent conductive lines is less than a threshold value, wherein the threshold value ranges from 30 to 100 micrometers, wherein a space between the ground conductive pattern and any one of the two adjacent conductive lines ranges from 5 to 20 micrometers.

2. The touch substrate according to claim 1, wherein the two adjacent conductive lines are in parallel with each other, and an extension direction of the ground conductive pattern is parallel to that of the two adjacent conductive lines.

3. The touch substrate according to claim 2, wherein the ground conductive pattern has a thickness in a direction perpendicular to the extension direction less than 90% of the space between the two adjacent conductive lines.

4. The touch substrate according to claim 3, wherein the ground conductive pattern has a thickness in a direction perpendicular to the extension direction greater than a half of the space between the two adjacent conductive lines.

5. The touch substrate according to claim 2, wherein the space between the ground conductive pattern and one of the two adjacent conductive lines is the same as that between the ground conductive pattern and the other of the two adjacent conductive lines.

6. The touch substrate according to claim 1, wherein the ground conductive pattern is made of a metal.

7. The touch substrate according to claim 1, further comprising:
a planarization layer covering the conductive lines and the ground conductive pattern.

8. A touch panel, comprising the touch substrate according to claim 1 and a protective structure covering the touch substrate.

9. The touch panel according to claim 8, further comprising:
a ground point located outside the touch substrate, wherein the protective structure is provided with a via hole, and the ground conductive pattern is electrically connected to the ground point through the via hole.

10. The touch panel according to claim 9, further comprising:

a conductive lead that passes through the via hole and connects the ground conductive pattern and the ground point.

11. The touch panel according to claim 8, wherein the protective structure is an anti-splinted film.

12. A method for manufacturing a touch substrate, the touch substrate being divided into a touch area and a wiring area surrounding the touch area, the method comprising:
forming a black matrix pattern on the wiring area;
forming a plurality of conductive lines on the black matrix pattern; and
forming a ground conductive pattern between two adjacent conductive lines of the plurality conductive lines,
wherein a space between the ground conductive pattern and any one of the two adjacent conductive lines ranges from 5 to 20 micrometers.

13. The method according to claim 12, wherein before the step of forming a black matrix pattern on the wiring area, the method further comprises:
providing a base substrate;
wherein the step of forming a black matrix pattern on the wiring area comprises: forming the black matrix pattern on the wiring area of the base substrate;
wherein before the step of forming a plurality of conductive lines on the black matrix pattern, the method further comprises:
depositing a first transparent conductive layer on the base substrate, patterning the first transparent conductive layer, and forming a bridge for connecting touch electrodes; and
depositing an insulating material layer on the base substrate, patterning the insulating material layer, and forming a pattern of a first insulating layer covering the bridge;
wherein the step of forming a conductive line on the black matrix pattern comprises:
depositing a second transparent conductive layer on the base substrate, patterning the second transparent conductive layer, and forming a pattern of the touch electrodes, the touch electrodes being formed by the conductive lines, and a groove being formed between the two adjacent conductive lines; and
wherein the step of forming a ground conductive pattern between the two adjacent conductive lines comprises:
depositing a metal layer on the base substrate, patterning the metal layer, and forming a peripheral metal line and the ground conductive pattern on the black matrix pattern.

14. The method according to claim 13, further comprising:
depositing a resin material layer on the base substrate, patterning the resin material layer, and forming a resin protective layer covering an edge area of the touch substrate on the base substrate.

15. The method according to claim 14, further comprising:
attaching an anti-splinted film on the touch substrate;
hollowing out the anti-splinted film to form a via hole; and
forming a conductive lead that connects a ground point and the ground conductive pattern through the via hole.

16. The method according to claim 13, wherein the groove has a width ranging from 30 to 100 micrometers.

17. A touch substrate, divided into a touch area and a wiring area located at a periphery of the touch area, comprising:
a black matrix pattern arranged on the wiring area;
a plurality of conductive lines located on the black matrix pattern; and
a ground conductive pattern located between two adjacent conductive lines of the plurality conductive lines on the black matrix pattern,
wherein a space between the ground conductive pattern and any one of the two adjacent conductive lines ranges from 5 to 20 micrometers.

18. The touch substrate according to claim 17, wherein the two adjacent conductive lines are in parallel with each other, and an extension direction of the ground conductive pattern is parallel to that of the two adjacent conductive lines.

19. The touch substrate according to claim 18, wherein the ground conductive pattern has a thickness in a direction perpendicular to the extension direction less than 90% of the space between the two adjacent conductive lines.

* * * * *